United States Patent [19]

Kelley et al.

[11] Patent Number: 5,087,848
[45] Date of Patent: Feb. 11, 1992

[54] SLOTTED BUS BAR FOR A PIEZOELECTRIC SOLID STATE MOTOR

[75] Inventors: Kurtis C. Kelley, Washington; John M. Sloma, Lacon, both of Ill.

[73] Assignee: Caterpillar Inc., Peoria, Ill.

[21] Appl. No.: 590,111

[22] Filed: Sep. 28, 1990

[51] Int. Cl.$^5$ .............................................. H01L 41/08
[52] U.S. Cl. ...................................... 310/328; 310/366
[58] Field of Search ............... 310/328, 366, 364, 365, 310/348–356, 340, 359

[56] References Cited

U.S. PATENT DOCUMENTS

| | | | |
|---|---|---|---|
| 1,813,461 | 7/1931 | Nicolson | 310/345 |
| 2,947,969 | 8/1960 | Harris | 310/369 X |
| 4,011,474 | 3/1977 | O'Neill | 310/369 X |
| 4,641,052 | 2/1987 | Kobayashi | 310/328 X |
| 4,725,753 | 2/1988 | Lien et al. | 310/366 X |
| 4,752,712 | 6/1988 | Tomita et al. | 310/366 X |

FOREIGN PATENT DOCUMENTS 0165381 7/1987 Japan ................................ 310/366

Primary Examiner—Mark O. Budd
Attorney, Agent, or Firm—Sterne, Kessler, Goldstein & Fox

[57] ABSTRACT

A slotted bus bar for a piezoelectric solid state motor stack having a housing encasing a plurality of piezoelectric disks which are interleaved with a plurality of electrodes. When the electrodes are connected to the slotted bus bar and the bar is biased by a source of electrical potential, an axial displacement is produced between the opposite end surfaces of the piezoelectric stack. The slotted bus bar has a spine and an attached or integral connector for connecting the slotted bus bar to a source of electrical potential. Also, the slotted bus bar has a plurality of integral ribs extending from the spine, between which are formed slots. When the slotted bus bar is assembled with the piezoelectric stack, the electrode tabs fit into the slots and contact the slotted bus bar. As results, the electrodes are structurally supported and good electrical contact is assured.

4 Claims, 1 Drawing Sheet

SLOTTED BUS BAR FOR A PIEZOELECTRIC SOLID STATE MOTOR

BACKGROUND OF THE INVENTION

1. Field of the Invention

The field of the invention relates generally to solid state motor actuators. More particularly, the invention relates to a slotted bus bar structure for piezoelectric solid state motor stacks.

2. Related Art

For decades electroexpansive materials have been employed in stacked structures for producing actuation used for fuel injection and valve control in diesel engines, for example. Commercially manufactured solid state motor stacks, or actuators, are produced using piezoelectric disks interleaved with metal foil electrodes. Application of high voltage, low current power to alternately biased electrodes causes each of the piezoelectric disks to expand or axially distort The additive deflection of the stacked disks is typically amplified by hydraulics to effectuate useful actuation.

An example of a conventional electromechanical actuator having an active element of electroexpansive 0 material is found in U.S. Pat. No. 3,501,099 to Glendon M. Benson. Benson's 1970 patent is directed to both an actuation amplification structure and a method for manufacturing piezoelectric stacks. Sheets of ceramic material are rolled, compacted and punched into ceramic disks. After a cleaning process, the disks are stacked with alternate sets of continuous disk electrodes disposed between the ceramic disks The stacks undergo a pressurized cool-welding process, followed by an elevated temperature and pressure bonding process after common electrodes are connected to the two electrode groups. The stacks are poled by application of a DC voltage and then encapsulated with a plastic insulative cover prior to final mounting within a transducer housing.

Benson's above-described electrode structure represents a common serial approach to electrode interconnection. Another common interconnection scheme is the bus bar approach.

The bus bar scheme uses a common bar or wire to connect every other electrode in a parallel fashion. Each electrode includes a tab portion extending tangentially from a point on the circumference of the electrode. The tab is used to solder or weld the bus bar to the electrode. Conventionally, each stack uses two bus bars to connect the power supply leads to the two respective interconnected electrode groups Both of the above-discussed electrode interconnection structures suffer from various disadvantages. Benson's strapped or chain structure makes assembly of ceramic disk/electrode stacks difficult. In contrast, structurally, the bus bar becomes somewhat rigid due to the soldering of the many tabs, thus, inhibiting stack actuation. Moreover, assembly and soldering of the bus bar structure requires many process steps.

The present invention overcomes the deficiencies of the conventional technology noted above.

SUMMARY OF THE INVENTION

The present invention is directed to a slotted bus bar for a piezoelectric solid state motor stack having a housing encasing a plurality of piezoelectric disks which are interleaved with a plurality of electrodes When the electrodes are connected to the slotted bus bar and the bar is biased by a source of electrical potential, an axial displacement is produced between the opposite end surfaces of the piezoelectric stack. The slotted bus bar has a spine and an attached or integral connector for connecting the slotted bus bar to a source of electrical potential. The slotted bus bar has a plurality of integral ribs extending from the spine, between which are formed slots. When the slotted bus bar is assembled with the piezoelectric stack, the electrode tabs fit into the slots and contact the slotted bus bar. As a result, the electrodes are structurally supported and good electrical contact is assured.

The invention may further include an extended portion beyond the plurality of integral ribs as discussed above. The extended portion may further include a connector section for connecting the slotted bus bar to a source of electrical potential.

FEATURES AND ADVANTAGES OF THE INVENTION

The present invention not only overcomes the deficiencies of conventional technology, noted above, but also provides the following features and advantages: First, since the slotted bus bar of the present invention has fixed slots to insert electrode tabs, the tabs are not only structurally supported by welds or fusions, but also by the added structure of the slots. This feature is advantageous since the lifetime of the stack is, in part, determined by how long operation may continue before a weld or fusion holding an electrode tab in-place fails.

Second, as a result of not depending on welds or fusions only, the slotted bus bar of the present invention will provide extended and more reliable operational output.

Finally, the slotted bus bar of the present invention allows welding or fusing of electrode tabs to be done more mechanically, efficiently, and accurately since the electrode tabs can be bent in one step to further allow welding or fusing in a more uniform fashion. Welding or fusing the tabs to the slotted bus bar can be done in an automated fashion, increasing production volume and efficiency.

BRIEF DESCRIPTION OF THE DRAWINGS

The invention will be better understood if reference is made to the accompanying drawing in which.

DETAILED DESCRIPTION OF THE PREFERRED EMBODIMENTS

Figure 1:
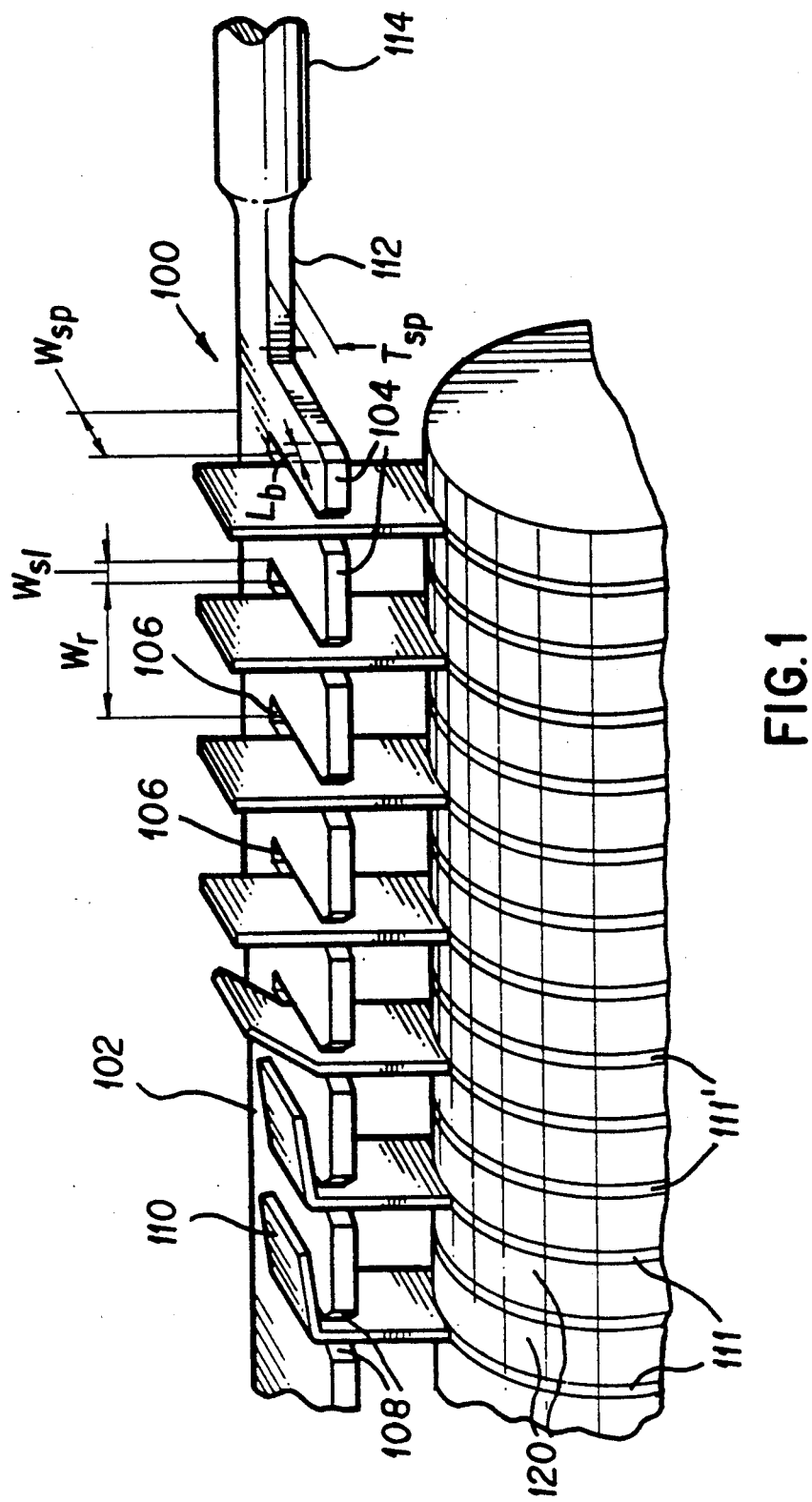
FIG. 1 shows a slotted bus bar positioned with electrode tabs and a piezoelectric solid state motor stack in connection with the present invention.

Broadly, the present slotted bus bar is intended for use with an automated manufacturing process to yield high-quality, high-durability solid state motor stacks in great volume. A reduced number of steps is required to attach the electrode tabs to the slotted bus bar, as compared to conventional bus bar assembly. Overall stack assembly time is thereby reduced.

FIG. 1 is a perspective view of a slotted bus bar 100 for use in conducting a current to generate an electric field potential in a piezoelectric solid state motor stack. In actual operation there should be at least two slotted bus bars 100, one for each pole of the electrical potential to be applied to the piezoelectric stack in order to produce axial expansion and contraction. It will therefore be understood by persons skilled in the relevant art that a second bus bar (not shown) lies substantially parallel to and is circumferentially offset from bus bar 100.

The preferred embodiment of an assembled piezoelectric solid state electrode/disk stack is described in the concurrently filed, commonly assigned co-pending application Ser. No. 07/589,855, filed 9/28/90, now abandoned, titled "Piezoelectric Solid State Motor Stack", the entire disclosure of which is incorporated herein by reference.

Spine member 102 has a plurality of integral rib portions 104. In the presently preferred embodiment, the ratio of the spine member width $W_{sp}$ to the rib width $W_r$ is about 1.46:1. The ratio of rib length $L_r$, measured from the outside edge of the spine member, to rib width $W_r$ is about 2.55:1. The thickness of the spine and integral ribs may be the same. The ratio of the rib width $W_r$ to the spine thickness $T_{sp}$ is about 2.74:1. This thickness may be dictated by the required strength, but is not critical to the invention. It should be understood that the foregoing dimensional relationships are exemplary only. Other suitable dimensions and relations can also be used.

The slotted bus bar and connector portion 114 may be stamped from a single piece of metal such as copper or beryllium-copper or any other electrically conductive material or alloy as would become evident by those skilled in the art. The slotted bus bar and the connector portion may also be milled, for example.

In the presently preferred embodiment, the rib portions 104 preferably have bevelled edges. The bevels typically have a length $L_b$ of about 3% of the rib length and are angled at about 45° measured from the lengthwise edge of a rib (i.e., 45° measured from a line perpendicular to the longitudinal axis of the spine member) The bevels allow for easy insertion of electrode tabs 110 which extend from electrodes 111 interleaved between piezoelectric disks 120. The rib portions 104 may also serve as welding or fusing surfaces for welding or fusing the bent-over electrode tabs 110 to the rib portions. The ribs 104 allow the electrode tabs 110 to be structurally supported while providing a current flow path between the bus bar 100 and electrodes 111.

It should be understood that electrodes 111' are interleaved with electrodes 111. Electrodes 111' are connected to the second bus bar (not shown) in the same manner as electrodes 111 are connected to bus bar 100.

Slots 106 are formed by the empty space between adjacent rib portions 104, and have a width $W_{sl}$ of about 3% of the rib width Bus bar 100 has an integral extended portion 112 Which extends beyond the ribs 104 and includes a connector portion 114. The connector portion 114 is shown as a cylindrical male connector, but may be any shape and/or female in structure to provide an external electrical connection to the slotted bus bar 100 and ultimately to the electrodes 111. The connector portion 114 need not be formed solid as part of the slotted bus bar 100. It may be welded or joined thereto. In the case of stamping, the connector portion 114 may be made by cylindrically bending the end of the stamped metal.

While various embodiments of the present invention have been described above, it should be understood that they have been presented by way of example, and not limitation. These examples are intended to cover elements or steps that perform substantially the same functions, in substantially the way to achieve the same result, as viewed by those of skill in the art. Thus the breadth and scope of the present invention should not be limited by any of the above-described exemplary embodiments, but should be defined only in accordance with the following claims and their equivalents.

We claim:

1. A slotted bus bar for a piezoelectric solid state motor stack having a housing encasing a plurality of piezoelectric disks interleaved with a plurality of electrodes including tabs, wherein when the electrodes are connected to the slotted bus bar and biased by a source of electrical potential, in axial displacement is produced between opposite end surfaces of the stack, comprising:

a substantially rigid spine member formed solely of electrically conductive material for connecting the bus bar to the source of electrical potential; and a plurality of ribs formed integrally with and extending from said spine member and defining slots therebetween, wherein when said bus bar is assembled with the stack, the electrode tabs extend through said slots and are electrically connected to said ribs.

2. A slotted bus bar according to claim 1, wherein said spine member further includes an extended portion beyond said plurality of ribs, wherein said extended portion includes a connector section for connecting the bus bar to the source of electrical potential.

3. A slotted bus bar according to claim 2, wherein said connector section is a cylindrical male connector.

4. A slotted bus bar for a piezoelectric solid state motor stack having a housing encasing a plurality of piezoelectric disks interleaved with a plurality of electrodes including tabs, wherein when the electrodes are connected to the slotted bus bar and biased by a source of electrical potential, an axial displacement is produced between opposite end surfaces of the stack, comprising:

a substantially rigid spine member formed solely of electrically conductive material for connecting the bus bar to the source of electrical potential, said spine member having an extended portion formed integrally therewith, said extended portion having a connector section formed integrally therewith for connecting the bus bar to the source of electrical potential; and a plurality of ribs formed integrally when and extending from said spine member and defining slots therebetween, wherein when said bus bar is assembled with the stack, the electrode tabs extend through said slots and are electrically connected to said ribs.

* * * * *

UNITED STATES PATENT AND TRADEMARK OFFICE
CERTIFICATE OF CORRECTION

PATENT NO.   :  5,087,848
DATED        :  February 11, 1992
INVENTOR(S)  :  Kurtis C. Kelley and John M. Sloma It is certified that error appears in the above-identified patent and that said Letters Patent is hereby corrected as shown below:

Claim 1, column 4, line 20, "in" should be --an--.

Claim 4, column 4, line 53, "when" should be --with--.

Signed and Sealed this

Twentieth Day of April, 1993

Attest:

MICHAEL K. KIRK

*Attesting Officer*   Acting Commissioner of Patents and Trademarks